United States Patent [19]

Almgren

[11] Patent Number: 4,487,652

[45] Date of Patent: Dec. 11, 1984

[54] SLOPE ETCH OF POLYIMIDE

[75] Inventor: Carl W. Almgren, Austin, Tex.

[73] Assignee: Motorola, Inc., Schaumburg, Ill.

[21] Appl. No.: 595,229

[22] Filed: Mar. 30, 1984

[51] Int. Cl.³ .................. B44C 1/22; C03C 15/00; C03C 25/06
[52] U.S. Cl. .................... 156/643; 156/644; 156/646; 156/651; 156/653; 156/657; 156/659.1; 156/668; 204/192 E
[58] Field of Search ............... 252/79.1; 156/643, 644, 156/646, 651–653, 655, 657, 659.1, 668; 204/164, 192 E; 427/39–41, 43.1

[56] References Cited

U.S. PATENT DOCUMENTS

| | | | |
|---|---|---|---|
| 4,140,572 | 2/1979 | Stein | 156/668 X |
| 4,218,283 | 8/1980 | Saiki et al. | 156/668 X |
| 4,411,735 | 10/1983 | Belani | 156/668 X |
| 4,417,947 | 11/1983 | Pan | 156/646 X |

Primary Examiner—William A. Powell
Attorney, Agent, or Firm—Anthony J. Sarli, Jr.; Jeffrey Van Myers; James L. Clingan, Jr.

[57] ABSTRACT

A sloped via through polyimide between metal layers is achieved by first sloping a hard mask which overlies the polyimide. Sloped photoresist overlying the hard mask transfers the slope to the hard mask. The sloped hard mask is used to slope the polyimide. Oxide underlying the polyimide is also etched to expose the metal. The underlying oxide layer can be subsequently slope etched.

8 Claims, 12 Drawing Figures

SLOPE ETCH OF POLYIMIDE

This invention relates to slope etching of polyimide, and more particularly, to slope etching of polyimide for forming contact vias in an integrated circuit.

BACKGROUND OF THE INVENTION

The desirability of higher speed and higher density in integrated circuits has resulted in multi-level conductor layers. Typically, in multi-level conductor integrated circuits, the lower layer or layers are polysilicon with the last layer being aluminum. Due to the heating involved during typical processing, aluminum was used as the last conductor layer only. Techniques have been developed using polyimide so that multi-level metal layers are feasible. The polyimide is used as insulation between metal layers. The polyimide insulating layer provides many of the benefits of insulating layers used between polysilicon and metal layers but without requiring nearly as much heat.

For an upper conducting layer to be useful, of course then it must be able to make contact with a lower conducting layer. In order for contact to be made, holes through the polyimide must be made. The holes are typically called "vias". A via is made in a location where electrical contact is to be made between two metal layers. The lower metal layer has a layer of polyimide overlying it through which vias are made at the desired locations. After the vias are made, the next layer of metal is deposited into the via, as well as on the polyimide, to make contact with the lower metal layer.

Initially, wet etching was suggested by the manufacturers of polyimides as the best way to produce vias. The wet etch methods produced vias quite reliably which had nearly optimum slopes. This worked very well until vias sizes were required to be less than 5 microns in diameter. The problems were that the vias were no longer etched clear in a reliable manner, and when the wafer was etched long enough to clear the vias, larger openings in the circuit were severely undercut. The next approach was to use a dry etch of the vias. The wafers with a photoresist mask over polyimide were dry etched in a plasma which contained oxygen. The oxygen plasma etched polyimide well, but it also etched the photoresist at the same or even faster rate. Consequently, the photoresist would often break down in areas where it was thin before all of the polyimide had completed etching in all parts of the circuit. To overcome this, a mask which did not erode under the plasma was used between the resist and the polyimide. This mask was etched at the location of the via, then the polyimide was reactive ion etched with an oxygen plasma. This allowed etching past the time which it took to clear the photoresist, which made it possible to overetch enough to clear the polyimide out of all parts of the circuit while forming the vias. The problem with this method was that the vias obtained had nearly vertical walls. The resulting poor metal step coverage causes a reduction in yield and consequently an increase in cost.

In an effort to produce more tolerable via profiles, relatively high pressure oxygen plasmas have been used to produce isotropic profiles, or a combination of high pressure oxygen plasma followed by a low pressure reactive ion etch to produce combination profiles. These procedures prove to be difficult to reproduce and require several different pieces of equipment used in sequence to run them, as well as giving less than ideal via profiles.

SUMMARY OF THE INVENTION

An object of the invention is to provide an improved via through polyimide.

Another object of the invention is to provide a method for improving the reliability of forming metal contact between two metal layers in which a polyimide layer is interposed therebetween.

Yet another object of the invention is to provide a method for improving vias from an upper surface of a polyimide layer through an underlying oxide layer to a metal layer.

These and other objects of the invention are achieved in an integrated circuit which has a metal layer and an overlying polyimide layer. A hard mask layer is deposited over the polyimide layer with a photoresist layer being subsequently deposited over the hard mask layer. The photoresist layer is etched at a via location. The hard mask is then slope etched in conjunction with the photoresist. The thus formed sloped hard mask is used to slope etch the polyimide to form a sloped via to the metal. An oxide layer may be useful for adherence and isolation purposes by underlying the polyimide layer in which case this oxide layer is etched while the polyimide is being slope etched.

DESCRIPTION OF THE INVENTION

Figure 1:
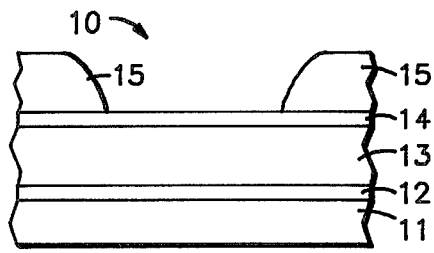
FIG. 1 is a cross section of a relevant portion of an integrated circuit at a stage in a process for forming a via according to the invention.

Shown in FIG. 1 is a portion 10 of an integrated circuit at a stage in a process for making a via. Portion 10 is comprised of lower layer 11 of metal, an insulating layer 12 which was deposited to overly layer 11, a layer 13 of polyimide which was deposited to overly layer 12, an insulating layer 14 which was deposited to overly layer 13, and a layer of photoresist 15 which was deposited to overly layer 14. Portion 10 in FIG. 1 shows an opening at a desired via location in photoresist layer 15 which will, after processing, determine the via. For example the opening can be 3 microns formed by any conventional technique. It is to be understood that under portion 10 will be a semiconductor substrate with other layers therebetween, for example, polysilicon, gate oxide, field oxide, and phosphorus doped oxide (phospho-silicate glass, known as PSG). The via to be formed is for the purpose of making electrical contact to metal layer 11 from a metal layer (not shown) to be formed over layer 14 and into the via. By way of example, the process is explained for layer 11 being 8 thousand Angstroms of aluminum, layer 12 being 3 thousand Angstroms of silicon oxide, layer 13 being 10 thousand Angstroms of polyimide, layer 14 being 3 thousand Angstroms of silicon oxide, and layer 15 being 12 thousand Angstroms of photoresist.

Figure 2:
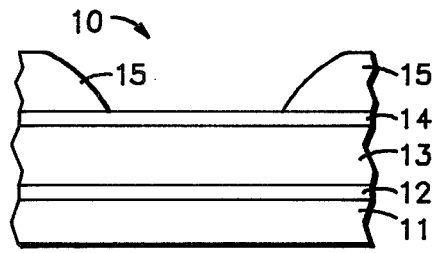
FIG. 2 is a cross section of said relevant portion at a stage in the process which is subsequent to that shown in FIG. 1.

In order to cause a less vertical slope, heat is applied so that photoresist layer 15 tends to flow. This also narrows the opening in photoresist layer 15 to, for example, 2.5 microns. The resultant slope and narrowed opening is shown in FIG. 2.

Figure 3:
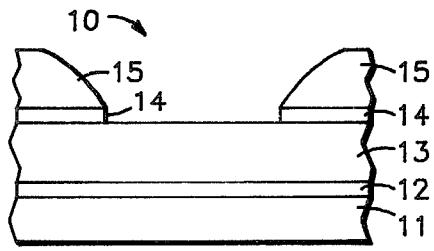
FIG. 3 is a cross section of said relevant portion at a stage in the process which is subsequent to that shown in FIG. 2.

The next step is to etch oxide layer 14 down to polyimide layer 13. This and other etching steps are achieved using, for example, an Applied Materials AME 8110 Reactive Ion Etcher. This etch of oxide layer 14 is achieved at one thousand watts of rf power using 75 SCCM of trifluoromethane $CHF_3$ and 10 SCCM of oxygen $(O_2)$ at 60 milliTorr for 8 minutes. The result of this step is shown in FIG. 3.

Figure 4:
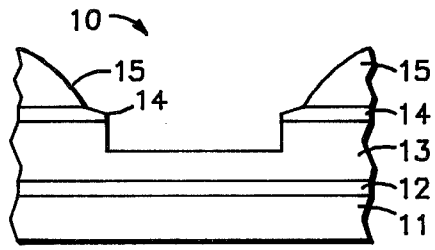
FIG. 4 is a cross section of said relevant portion at a stage in the process which is subsequent to that shown in FIG. 3.
Figure 5:
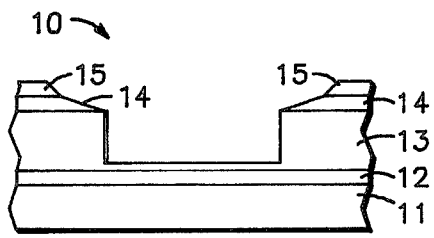
FIG. 5 is a cross section of said relevant portion at a stage in the process which is subsequent to that shown in FIG. 4.

After oxide layer 14 has been etched, oxide layer 14 is sloped. The slope of photoresist layer 15 is transferred to oxide layer 14 at this step. The etch is achieved at one thousand watts with 50 SCCM of $CHF_3$ and 55 SCCM of $O_2$ at 60 milliTorr for about 10 minutes. This predetermined etching selectivity of 3:1 between photoresist and oxide gives the desired slope transfer. The progress of this etch after about 5 minutes is shown in FIG. 4. This step also etches polyimide at about the same rate as photoresist. Consequently, polyimide layer 13 is etched at the via location during this step. The step is terminated when oxide layer 14 is etched through to expose polyimide at the edge of the via location. The duration can be determined experimentally to obtain this result. The result at the termination of this step is shown in FIG. 5.

Figure 6:
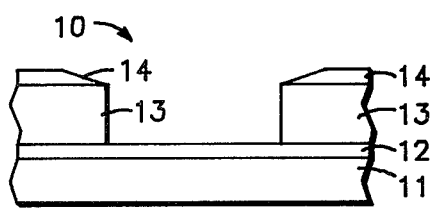
FIG. 6 is a cross section of said relevant portion at a stage in the process which is subsequent to that shown in FIG. 5.

Some of photoresist layer 15 still remains. Also some of polyimide layer 13 remains at the via location. Consequently, a step is needed to clear this photoresist and polyimide. This is achieved at one thousand watts with 100 SCCM of $O_2$ at 40 milliTorr for 4 minutes. The result of this step is shown in FIG. 6.

Figure 7:
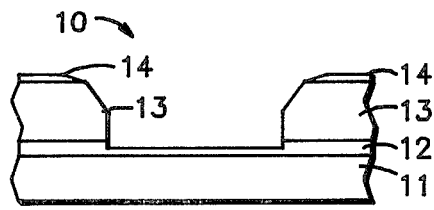
FIG. 7 is a cross section of said relevant portion at a stage in the process which is subsequent to that shown in FIG. 6.
Figure 8:
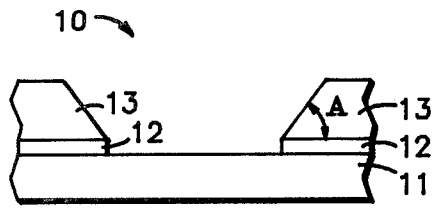
FIG. 8 is a cross section of said relevant portion showing a completed via according to the invention.

After clearing the photoresist and the polyimide in the via location, the slope of oxide layer 14 is transferred to polyimide layer 13. This is achieved at one thousand watts with 50 SCCM of $CHF_3$ and 55 SCCM of $O_2$ at 60 milliTorr for approximately 8 minutes. This predetermined etching selectivity of 1:3 between oxide and polyimide gives the desired slope transfer. After, about 4 minutes, polyimide layer 13 has been sloped about halfway down as shown in FIG. 7. Oxide layer 12 is etched in the via location during this step. Upon completion of this step, polyimide layer 13 is sloped from oxide layer 12 to the upper surface of polyimide layer 13 at an angle A shown in FIG. 8. For the example described, angle A is approximately 50 degrees which is excellent for making contact with aluminum. Consequently, FIG. 8 shows a completed sloped via useful for reliably making electrical contact with aluminum (not shown) overlying polyimide layer 13 to aluminum layer 11. After this step, however, there may be some residual oxide in the via on metal layer 11 and on polyimide layer 13. Consequently, it may be necessary to have additional step to clear this residual oxide before applying the aluminum to the via. This can be achieved at 1000 watts with 75 SCCM of $CHF_3$ and 10 SCCM $O_2$ at 60 milliTorr for 5 minutes.

Figure 9:
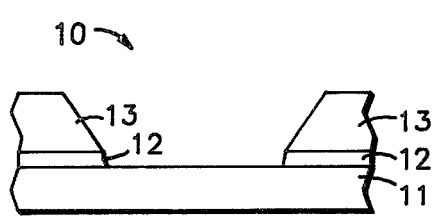
FIG. 9 is a cross section of said relevant portion after additional processing to further slope the via.

The via shown in FIG. 8 with a 2.5 micron opening to the aluminum layer 11 has experimentally been shown to be reliably effective for making electrical contact. As geometries are reduced as well as other changes in processing which are likely to occur, the vertical edge of oxide layer 12 may present a problem. This vertical edge can easily be sloped with another processing step. This is achieved at one thousand watts with 70 SCCM of $CHF_3$ and 30 SCCM of $O_2$ at 60 milliTorr. The result is shown in FIG. 9. As previously indicated at 2.5 microns the via has experimentally been shown to be effective with a vertical wall on oxide layer 12 which is only 3 thousand Angstroms thick. The purpose of this oxide layer is to provide good adherence to polyimide layer 13. Polyimide does adhere well to aluminum, but there will be substantial portions of the integrated circuit in which aluminum layer 11 has been etched. Only the portion relevant to making a via has been shown in the figures. The locations where aluminum layer 11 have been etched would cause polyimide layer 13 to be in contact with the layer which underlies aluminum layer 11 if it were not for the presence of oxide layer 12. Typically, the layer underlying aluminum layer 11 will be phospho-silicate glass (PSG). Because polyimide does not adhere well to PSG, it has been desirable to deposit silicon oxide before depositing polyimide, thus the presence of oxide layer 12 in the figures. In cases where oxide layer 12 is not required, polyimide layer 13 can be directly on aluminum layer 11 so that the slope of polyimide layer 13 can begin at aluminum layer 11.

Figure 10:
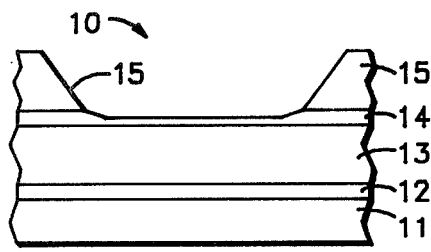
FIG. 10 is a cross section of said relevant portion using alternative processing according to the invention subsequent to the processing stage of FIG. 2.
Figure 11:
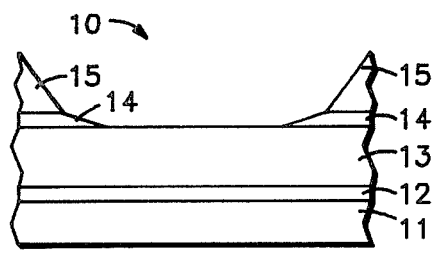
FIG. 11 is a cross section of said relevant portion at stage in the alternative processing subsequent to that shown in FIG. 10.
Figure 12:
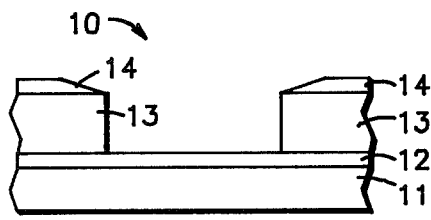
FIG. 12 is a cross section of said relevant portion at a stage in the alternative processing subsequent to that shown in FIG. 11.

The process to obtain the desired via can be altered somewhat to obtain the same desired result. After baking photoresist layer 15 to obtain the result shown in FIG. 2, instead of etching oxide layer 14 to obtain the result shown in FIG. 3, oxide layer 14 is slope etched. This is achieved at one thousand watts with 50 SCCM of $CHF_3$ and 55 SCCM of $O_2$ at 60 milliTorr for 10 minutes. The progress of this step after about 5 minutes is shown in FIG. 10. The result of the completed step is shown in FIG. 11. There remains some of photoresist layer 15 which is removed while vertically etching polyimide layer 13. Polyimide layer 13 is vertically etched at one thousand watts with 100 SCCM of $O_2$ at 40 milliTorr for 10 minutes. The result is shown in FIG. 12 which is the same as the result shown in FIG. 6. Consequently, the process steps used following the result shown in FIG. 6 can be used following the result shown in FIG. 12 to obtain the desired via. An advantage of this alternative is that the duration of the step for sloping oxide layer 14 is less critical. If etching continues for awhile after polyimide layer 13 has been exposed, the slope of oxide layer 14 will remain the same with only a slight widening of the via. In the method first described, polyimide layer 13 is etched deeply during the sloping of oxide layer 14 so that if etching occurs a little too long, oxide layer 14 will pull away from the polyimide edge.

The techniques, which have been described in detail, are considered to be well suited for current use. More generally through, a hard mask which has a high degree of selectivity in etching relative to photoresist and polyimide, is sloped etched in conjunction with photoresist. Described herein, the hard mask is oxide layer 14. The sloped hard mask is then used to slope etch the polyimide, polyimide layer 13 described herein. An alternative hard mask might be nitride. Oxide is considered better because of the need for an oxide layer under polyimide. The process is simplified since deposited oxide is necessary anyway.

While the invention has been described in a preferred embodiment, it will be apparent to those skilled in the art that the disclosed invention may be modified in numerous ways and assume many embodiments other than that specifically set out and described above. Accordingly, it is intended by the appended claims to cover all modifications of the invention which fall within the true spirit and scope of the invention.

I claim:

1. In a semiconductor having an insulating layer overlying a metal layer, wherein the insulator comprises an upper oxide layer, an intermediate polyimide layer, and a lower oxide layer in contact with the metal layer, a method for etching a via from an upper surface of the polyimide layer to the metal layer comprising the steps of:

applying photoresist;

etching an opening from an upper surface of the photoresist layer to the upper oxide layer at a location for forming the via so that an upper surface of the upper oxide layer is exposed at the via location;

heating the photoresist to cause a more gradual slope of the photoresist layer from the upper surface of the upper oxide layer at the via location to the upper surface of the photoresist layer;

applying reactive ion etchant with a predetermined selectivity between photoresist and oxide to transfer the slope of the photoresist layer to the upper oxide layer at a predetermined ratio; and applying a reactive ion etchant with a predetermined selectivity between oxide and polyimide to transfer the slope of the upper oxide layer to the polyimide layer at a predetermined ratio, whereby the lower oxide layer is simultaneously etched to expose the metal layer at the via location.

2. The method of claim 1 further comprising the step of:

applying a reactive ion etchant which etches oxide at a much greater rate than polyimide to clear the exposed metal and polyimide surface of any residual oxide.

3. The method of claim 2 wherein all of the etchants are a plasma which contains oxygen.

4. The method of claim 3 further comprising the step of:

applying a reactive ion etchant, after heating the photoresist, to etch the upper oxide layer at the via location through to the polyimide layer.

5. The method of claim 3 further comprising the step of:

applying a reactive ion etchant, after transferring the slope of the photoresist layer to the upper oxide layer, to selectively etch the polyimide in via location.

6. The method of claim 5 wherein the selective etching of the polyimide is through to the lower oxide layer.

7. The method of claim 1 further comprising the step of:

applying a reactive ion etchant, after transferring the slope of the upper oxide layer to the polyimide layer, with a predetermined selectivity between oxide and polyimide to transfer the slope of the polyimide to the lower oxide layer at a predetermined ratio.

8. In a semiconductor having a polyimide layer overlying a metal layer, a method for forming a via from an upper surface of the polyimide to the metal comprising the steps of:

applying a hard mask layer to the upper surface of the polyimide layer;

applying a photoresist layer over the hard mask layer;

etching at the via location an opening in the photoresist layer from an upper surface of the photoresist layer to the upper oxide layer;

applying an etchant to cause the hard mask to have a predetermined slope at the via location; and applying an etchant to cause the polyimide to have a predetermined slope at the via location.

* * * * *